United States Patent
Park et al.

(10) Patent No.: US 9,759,741 B2
(45) Date of Patent: Sep. 12, 2017

(54) TEST BOARD, TEST SYSTEM INCLUDING THE SAME, AND MANUFACTURING METHOD THEREOF

(71) Applicant: SAMSUNG ELECTRONICS CO., LTD., Suwon-si (KR)

(72) Inventors: Sooyong Park, Asan-si (KR); Yong chul Jang, Asan-si (KR); Kijae Song, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/863,703

(22) Filed: Sep. 24, 2015

(65) Prior Publication Data
US 2016/0091531 A1  Mar. 31, 2016

(30) Foreign Application Priority Data
Sep. 25, 2014 (KR) ........................ 10-2014-0128192

(51) Int. Cl.
*G01R 1/04* (2006.01)
*G01R 31/28* (2006.01)

(52) U.S. Cl.
CPC ....... *G01R 1/0408* (2013.01); *G01R 31/2889* (2013.01)

(58) Field of Classification Search
CPC combination set(s) only.
See application file for complete search history.

(56) References Cited

U.S. PATENT DOCUMENTS

| | | |
|---|---|---|
| 6,191,479 B1 | 2/2001 | Herrell et al. |
| 6,407,930 B1 | 6/2002 | Hsu |
| 7,166,917 B2 | 1/2007 | Yang et al. |
| 7,622,325 B2 | 11/2009 | Shim et al. |
| 7,723,833 B2 | 5/2010 | Mehta et al. |
| 7,902,664 B2 | 3/2011 | Bang et al. |
| 8,174,116 B2 | 5/2012 | Masuda et al. |
| 8,520,402 B1 | 8/2013 | Sivasubramaniam |
| 8,618,651 B1 | 12/2013 | Yee |
| 8,933,718 B2 | 1/2015 | Laquai |
| 2003/0147226 A1* | 8/2003 | Devey ............... H05K 1/0231 361/782 |
| 2005/0124186 A1 | 6/2005 | Young et al. |
| 2006/0145339 A1 | 7/2006 | Yang et al. |
| 2007/0096282 A1 | 5/2007 | Shim et al. |
| 2007/0145989 A1* | 6/2007 | Zhu ................. G01R 1/06772 324/754.07 |

(Continued)

*Primary Examiner* — Clayton E Laballe
*Assistant Examiner* — Jas Sanghera
(74) *Attorney, Agent, or Firm* — Sughrue Mion, PLLC

(57) ABSTRACT

Provided is a test board including a main board which is configured to be connected to a plurality of devices-under-test (DUTs) and includes a plurality of test signal paths for transmitting a plurality of test signals input from an external tester to pins of at least one of the DUTs or transmitting a test result from the DUT to the tester, and a farm board which is connected to the main board and configured to mount therein a plurality of passive elements which are configured to be connected to at least one of the pins of the DUT through at least one of the test signal paths of the main board, when a test operation is performed, thereby improving a power integrity property or a signal integrity property in the test operation.

17 Claims, 11 Drawing Sheets

(56) References Cited

U.S. PATENT DOCUMENTS

| | | |
|---|---|---|
| 2008/0023812 A1 | 1/2008 | Bang et al. |
| 2008/0054435 A1 | 3/2008 | Mehta et al. |
| 2008/0196303 A1 | 8/2008 | Kim |
| 2010/0197151 A1 | 8/2010 | Bet-Shliemoun |
| 2011/0090662 A1 | 4/2011 | Jang et al. |
| 2011/0127680 A1 | 6/2011 | Masuda et al. |
| 2011/0187399 A1 | 8/2011 | Laquai |
| 2012/0049873 A1* | 3/2012 | Bourstein .......... G01R 31/3004 324/750.01 |
| 2012/0054565 A1* | 3/2012 | Huang .................. G11C 29/26 714/719 |
| 2012/0080222 A1 | 4/2012 | Kim et al. |
| 2012/0168217 A1 | 7/2012 | Hsu et al. |
| 2013/0161788 A1 | 6/2013 | Chun et al. |
| 2013/0342236 A1 | 12/2013 | Song et al. |

\* cited by examiner

TEST BOARD, TEST SYSTEM INCLUDING THE SAME, AND MANUFACTURING METHOD THEREOF

CROSS-REFERENCE TO THE RELATED APPLICATIONS

This application claims priority from Korean Patent Application No. 10-2014-0128192, filed on Sep. 25, 2014, the entire contents of which are hereby incorporated by reference.

BACKGROUND

Example embodiments of the inventive concept relate to a test board, a test system including the same, and a method of manufacturing fabricating the same.

A test board is used to transmit test signals from automatic test equipment (ATE) to a device under test. For example, a printed circuit board (PCB) of a probe card may include a trace for transmitting the test signals from the ATE to the device under test.

SUMMARY

Example embodiments of the inventive concept provide a test board, which is suitable for a high speed chip and can be manufactured at a low cost.

According to example embodiments of the inventive concept, there is provided a test board which may include a main board configured to be connected to a plurality of devices-under-test (DUTs) and including a plurality of test signal paths for transmitting a plurality of test signals input from an external tester to pins of at least one of the DUTs or transmitting a test result from the DUT to the tester. The test board also includes a farm board connected to the main board and configured to mount therein a plurality of passive elements which are configured to be connected to at least one of the pins of the DUT through at least one of the test signal paths of the main board, when a test operation is performed, thereby improving a power integrity property or a signal integrity property in the test operation.

The main board or the farm board may be provided in a form of a printed circuit board. The main board may include a plurality of layers for routing the test signal paths.

At least one of the pluralities of layers of the main board may be configured to provide four or six test signal paths connected to two input-output (I/O) pins of the DUT. Here, at least two of the four or six test signal paths may be connected to the two I/O pins of the DUT through a via penetrating the plurality of layers of the main board.

At least two of the plurality of DUTs may share at least one of the test signal paths. At least one of the test signal paths may be configured to use a via penetrating at least two of the plurality of layers.

The test board may further include a plurality of connectors configured to be connected to the pins of the DUT, receive the test signals from the tester, and output the test results to the tester. The connectors may be configured to share at least one of the test signals.

The main board may be combined with the farm board using solder balls.

At least one of the pins may be connected to a pin of the farm board through a via penetrating the main board.

The pins of the DUT may include at least one power voltage pin and at least one ground voltage pin, and the main board may further include at least one first layer including a conductive material to be connected to the at least one power voltage pin, and at least one second layer including a conductive material to be connected to the at least one ground voltage pin.

The passive elements included in the farm board may include at least one de-coupling capacitor to be electrically connected to the at least one power voltage pin.

The de-coupling capacitor may be configured to connect the at least one power voltage pin electrically to the at least one ground voltage pin.

The farm board may include a plurality of layers in which a plurality of signal paths are provided for connecting the passive elements to the main board.

At least one of the pluralities of layers of the farm board may include a de-coupling capacitor, and another at least one of the plurality of layers may include a resistor.

According to example embodiments of the inventive concept, there is provided a test system which may include the above test board and the external tester.

In the test system, the pins may include a first power voltage pin, a second power voltage pin, and a ground voltage pin, and the main board may include a first layer including a conductive material to be connected to the first power voltage pin, a second layer including a conductive material to be connected to the second power voltage pin, and a third layer provided between the first and second layers which includes a conductive material to be connected to the ground voltage pin.

At least one of the passive elements of the farm board may be a de-coupling capacitor. The farm board may further include a sub-board including solder balls connected to the main board, and the de-coupling capacitor may be mounted on the sub-board and be connected to at least one of the solder balls through a via penetrating the sub-board.

The farm board may further include a sub-board including solder balls connected to the main board, a first layer provided on the sub-board and including at least one de-coupling capacitor, and a second layer provided on the first layer and including at least one de-coupling capacitor.

The main board may further include a socket, allowing for a selective combination with the farm board.

The tester may be automatic test equipment (ATE).

According to example embodiments of the inventive concept, there is provided a test board which may include a first board configured to be connected to a plurality of devices for testing of the devices and including a plurality of test signal paths through which a plurality of test signals for the testing are exchanged between an external tester and a plurality of terminals of at least one of the devices. The test board also includes a plurality of terminals which is configured to be connect to a second board comprising a plurality of passive elements so that at least one of the passive elements is connected to at least one terminal of the device through at least one of the test signal paths included in the first board.

The first board may include a plurality of layers at least one of which provides two or more test signal paths, among the plurality of test signal paths, connected to two I/O pins of at least one of the devices. Here, the at least one of the layers which provides the two or more signal paths connected to the two I/O pins of the at least one of the devices includes an I/O pad region, a ground pad region and a command/address pad region.

The main board may include at least one layer configured to be connected to a power voltage and at least one layer configured to be connected to a ground voltage. At least one of the test signal paths may be shared by at least two of the plurality of devices.

According to example embodiments of the inventive concept, there is a method of manufacturing a test board. The method may include manufacturing a main board comprising at least one socket configured to allow for electrical connections with a plurality of DUTs, the main board being configured to include a plurality of test signal paths configured to be connected to a plurality of pins of at least one of the DUTs, manufacturing a farm board, in which at least one de-coupling capacitor for improving a power integrity property are provided, and connecting the farm board with the main board to connect at least one power voltage pin of the pins of the DUT electrically with the de-coupling capacitor.

BRIEF DESCRIPTION OF THE DRAWINGS

Example embodiments will be more clearly understood from the following brief description taken in conjunction with the accompanying drawings. The accompanying drawings represent non-limiting example embodiments as described herein.

Figure 1:
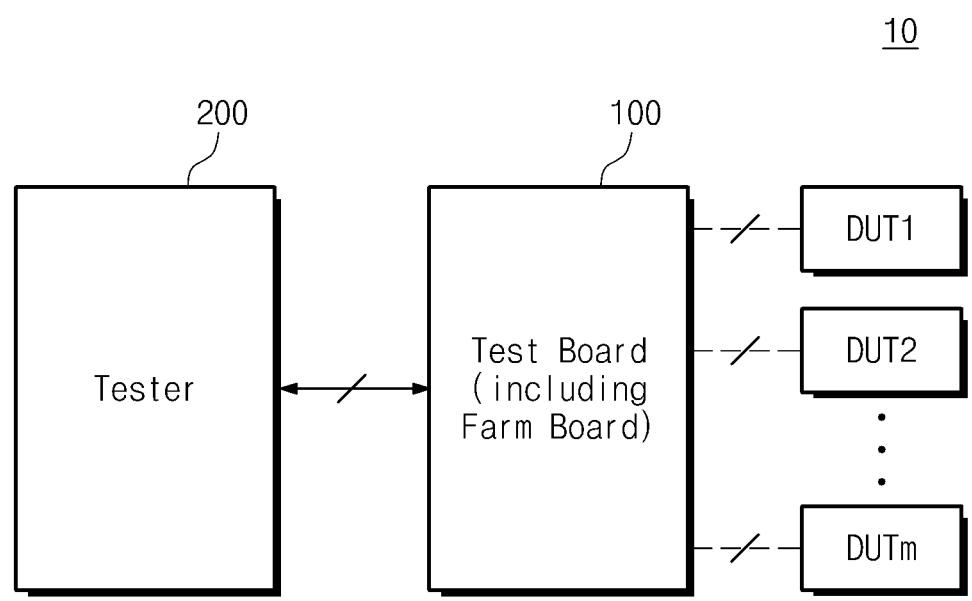
FIG. 1 is a block diagram illustrating a test system according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXAMPLE EMBODIMENTS

Example embodiments of the inventive concept will now be described more fully with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a test system according to an example embodiment of the inventive concept. Referring to FIG. 1, a test system 10 may include a test board 100, which is electrically/physically connected to a plurality of devices under test (DUTs) DUT1-DUTm (where m is an integer of 2 or higher), and a tester 200 configured to test the DUTs DUT1-DUTm connected to the test board 100.

Each of the DUTs DUT1-DUTm may receive a test signal including test data, perform a test operation, and output a result of the test operation. Each of the DUTs DUT1-DUTm may be a device (e.g., an integrated circuit, a memory device, and a memory module), on which the test operation will be performed.

Test signals to be input from the tester 200 may be transmitted to the DUTs DUT1-DUTm in a separate, independent, or en-bloc manner via the test board 100, and results of test operations may be transmitted to the tester 200 via the test board 100. In other words, the test board 100 may serve as an interface circuit between the tester 200 and the DUTs.

The test board 100 may include a plurality of layers constituting test signal paths, which are electrically connected to input-output (I/O) pins, power pins, control (e.g., address/command) pins, or pins of the DUTs DUT1-DUTm. Test signals, test data, or test results may be input or output between the DUTs DUT1-DUTm and the tester 200 via the test signal paths. In example embodiments, vias may be provided between the layers, which makes it possible to diversify a routing structure of the test signal paths.

In certain example embodiments, the test board 100 may be a printed circuit board (PCB).

Further, although not shown, the test board 100 may include sockets provided for electrical/physical connections with the DUTs DUT1-DUTm. The test board 100 may also include connectors connected to test signal lines of the tester 200.

In particular, the test board 100 may include a farm board (not shown). The farm board may be a subsidiary/additional board electrically and/or physically coupled with a main board of the test board 100. The farm board may include a passive and/or active element configured to improve power integrity or signal integrity, when a test operation is performed. For example, the farm board may include at least one de-coupling capacitor, at least one inductor, or at least one resistor, and so forth. In example embodiments, the farm board may be a PCB. In example embodiments, the farm board may be coupled with the main board of the test board 100 through solder balls. In other example embodiments, the farm board may be coupled with the main board of the test board 100 through at least one socket.

The tester 200 may generate test signals (including test data) for testing the DUTs DUT1-DUTm. Further, the tester 200 may receive the test results and then determine whether each of DUTs DUT1-DUTm fails or not.

In example embodiments, the tester 200 may include or be automatic test equipment (ATE). The ATE may include internal hardware components and a processor for controlling the internal hardware components. Here, the internal hardware components may include a programmable power supply, a direct current (DC) parameter measurement unit, an algorithmic pattern generator, a timing generator, a wave sharp formatter, a drive channel, an I/O channel, a power channel, and so forth. In the ATE, signal communication between the hardware components may be governed by the processor or a test program thereon, so as to electrically test the DUTs DUT1-DUTm connected thereto via the test board 100.

The test program may be classified into a DC test, an alternating current (AC) test, and a function test. The function test may be performed to check whether a semiconductor memory device (e.g., DRAM) is normally or properly operated under an actual operation circumstance. For example, the function test may include a write operation of writing an input pattern from the algorithmic pattern generator of the ATE to the DUT (e.g., DRAM), a read operation of reading out an output pattern from the DUT DRAM, and a compare operation of comparing it with an expected pattern using a comparator.

There is an increasing demand for a semiconductor chip with a high speed and low operation voltage, and thus, the power integrity is one of the most important issues of the semiconductor technology. In the case of a related art test board, to overcome the power integrity issue, a de-coupling capacitor is used in the test board. As improved performance is needed for the semiconductor chip, the number of the de-coupling capacitors required is being continuously increased. For example, in order to test recent semiconductor chips, several hundreds of de-coupling capacitors are mounted on the test board. In addition, although the related art test board is configured to have many de-coupling capacitors, the related art test board has high power impedance at a target speed, and this leads to a significant reduction in power margin (e.g., LVDD margin) of an actual test operation. Moreover, due to the presence of many de-coupling capacitors, many vias should be provided in the related art test board, and the vias may lead to a difficulty in reducing lengths of test signal paths or to complexity of routing. In other words, the related art test board may suffer from poor signal integrity property.

By contrast, according to example embodiments of the inventive concept, the test board 100 may include an extra farm board, which is coupled with a main board and thereby contributes to improve a signal integrity or power integrity property thereof. In example embodiments, the test board 100 may include the main board and the farm board, which is coupled with the main board and has at least one de-coupling capacitor, and this makes it possible to overcome limitation in designing a test board with dependency on a mounting structure of the de-coupling capacitor and limitation in a space for mounting de-coupling capacitors. Further, in the test board 100, it is unnecessary to directly mount a de-coupling capacitor, and thus, it is possible to reduce the number of the vias and a length of the test signal path. Accordingly, the test operation can be performed with an improved signal integrity property. Further, the test board 100 may be configured to have a simple routing structure of the test signal path, and thus, it is possible to reduce the number of layers required for the routing. Accordingly, it is possible to remarkably reduce fabrication cost of the test board 100, compared with that of the related art one.

Figure 2A:
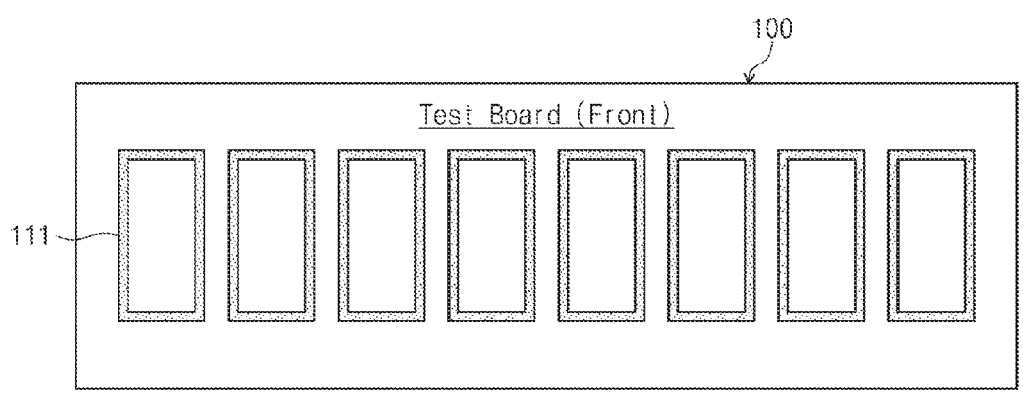
FIGS. 2A and 2B are top and bottom views of a test board shown in FIG. 1 according to example embodiments of the inventive concept.
Figure 2B:
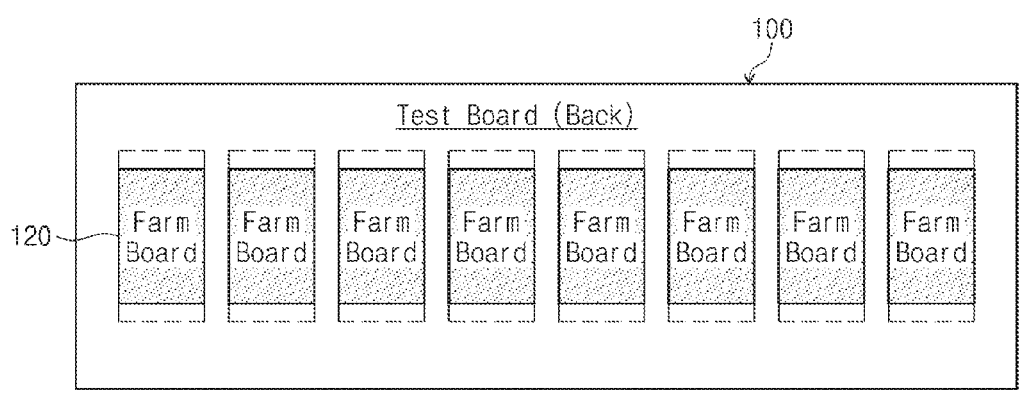

FIGS. 2A and 2B are top and bottom views illustrating top and bottom surfaces, respectively, of the test boards shown in FIG. 1. Referring to FIG. 2A, a plurality of sockets 111 may be provided on a top surface of the test board 100. The sockets 111 may allow for electrical/physical connections with DUTs. In order to reduce complexity in the drawings and to provide better understanding of example embodiments of the inventive concept, eight sockets 111 are illustrated in FIG. 2A. However, the number of the sockets 111 on the top surface of the test board 100 is not limited thereto. Referring to FIG. 2B, a plurality of farm boards 120 may be disposed on a bottom surface of the test board 100. The farm boards 120 may allow for improvement in the power integrity or signal integrity property, when a test operation is performed on the DUTs. In example embodiments, as shown in FIG. 2B, a size of a farm board 120 may be smaller than or equal to that of a socket region corresponding to each DUT.

Figure 3:
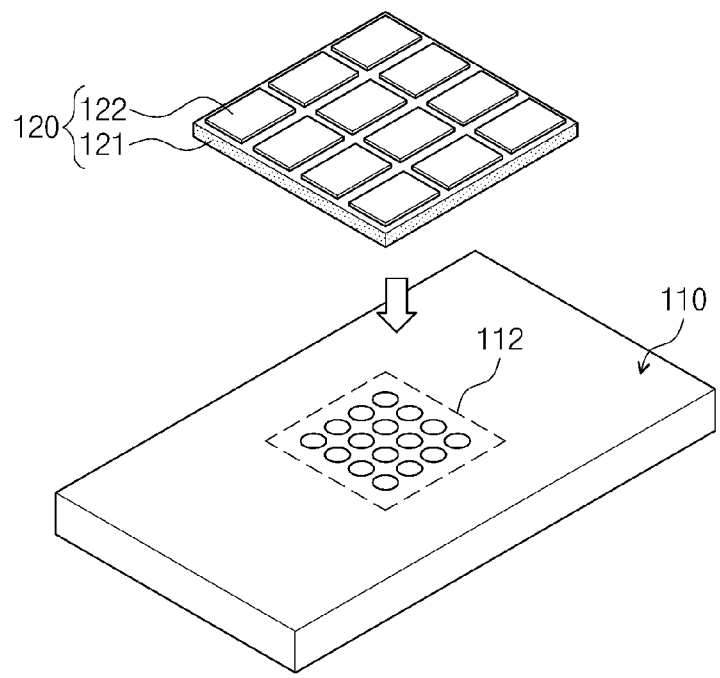
FIG. 3 is a perspective view schematically illustrating a portion of a test board shown in FIG. 1 according to example embodiments of the inventive concept.

FIG. 3 is a perspective view schematically illustrating a portion of the test board 100 shown in FIG. 1. Referring to FIG. 3, a test board 100 may include a main board 110 and a farm board 120. The main board 110 may include a contact portion 112, which is configured to be connected to a bottom portion of the farm board 120. The contact portion 112 may include pads with which solder balls of the farm board 120 are connected.

The farm board 120 may include a sub-board 121 and passive elements 122 mounted on the sub-board 121. Here, at least one of the passive elements 122 may be a de-coupling capacitor. The passive elements 122 may be electrically connected to the contact portion 112 of the main board 110.

Figure 4:
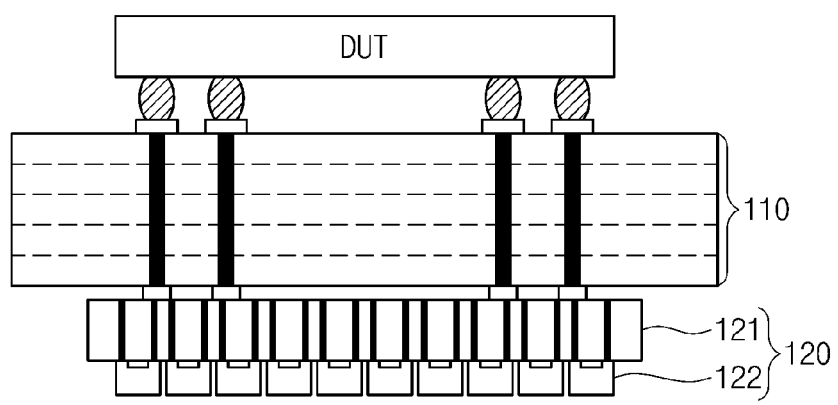
FIG. 4 is a sectional view illustrating an example of a test board, on which a DUT is mounted.

FIG. 4 is a sectional view illustrating an example of a test board 100, on which a DUT is mounted. Referring to FIG. 4, some of pins of the DUT may penetrate layers of the test board 110 and a layer(s) of the sub-board 121 of a farm board 120 and may be electrically connected to the passive element 122. Here, the passive element 122 may be a de-coupling capacitor. In the case where the passive element 1220 is a de-coupling capacitor, some of the pins of the DUT may be power pins.

In example embodiments, the pins of the DUT may be connected to a top surface of the main board 110 using solder balls. In example embodiments, the farm board 120 may be coupled with a bottom surface of the main board 110 using solder balls.

Some of the pins of the DUT shown in FIG. 4 may be directly connected to the farm board 120 through vias penetrating the layers of the main board 110, but the inventive concept is not limited thereto. Some of the pins of the DUT may be connected to the farm board 120 through various test signal paths configured using the layers of the main board 110.

Figure 5:
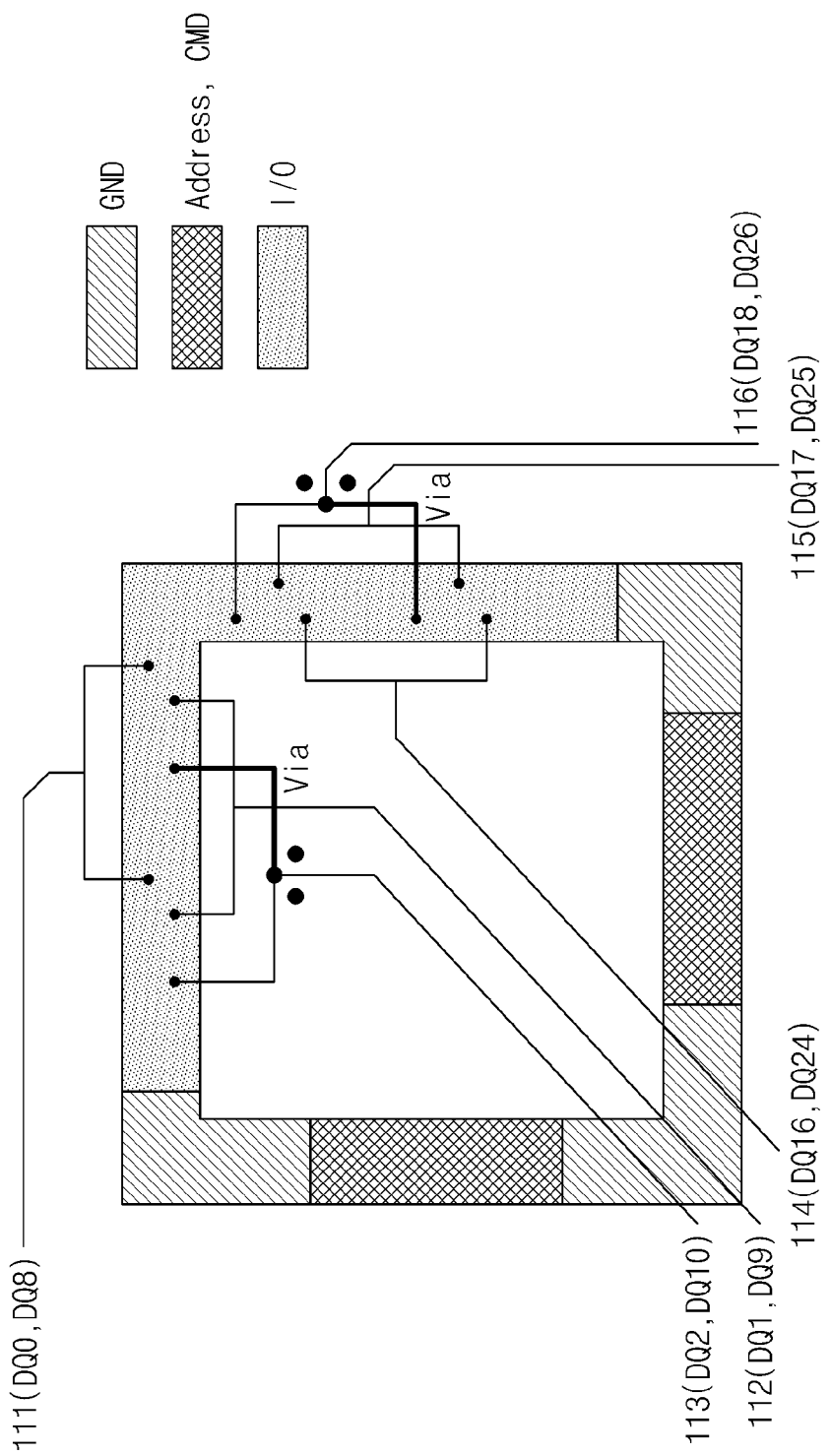
FIG. 5 is a wiring diagram illustrating a test signal path according to example embodiments of the inventive concept.

FIG. 5 is a wiring diagram illustrating a test signal path according to example embodiments of the inventive concept. Referring to FIG. 5, a top surface of a test board 100 may be divided into an I/O pad region, an address/command pad region, and a ground pad region. For example, as shown in FIG. 5, six test signal paths 111-116 may be provided in a single layer. Each of the test signal paths 111-116 may be electrically connected to two I/O pins.

In example embodiments, at least one (e.g., 113 and/or 116) of the test signal paths 111-116 may be divided into at least two paths to be connected to two I/O pins through a via.

Meanwhile, as shown in FIG. 5, six test signal paths may be provided in a single layer, but the inventive concept is not limited thereto. For example, the number of the test signal paths to be disposed in a single layer may be variously changed.

Figure 6:
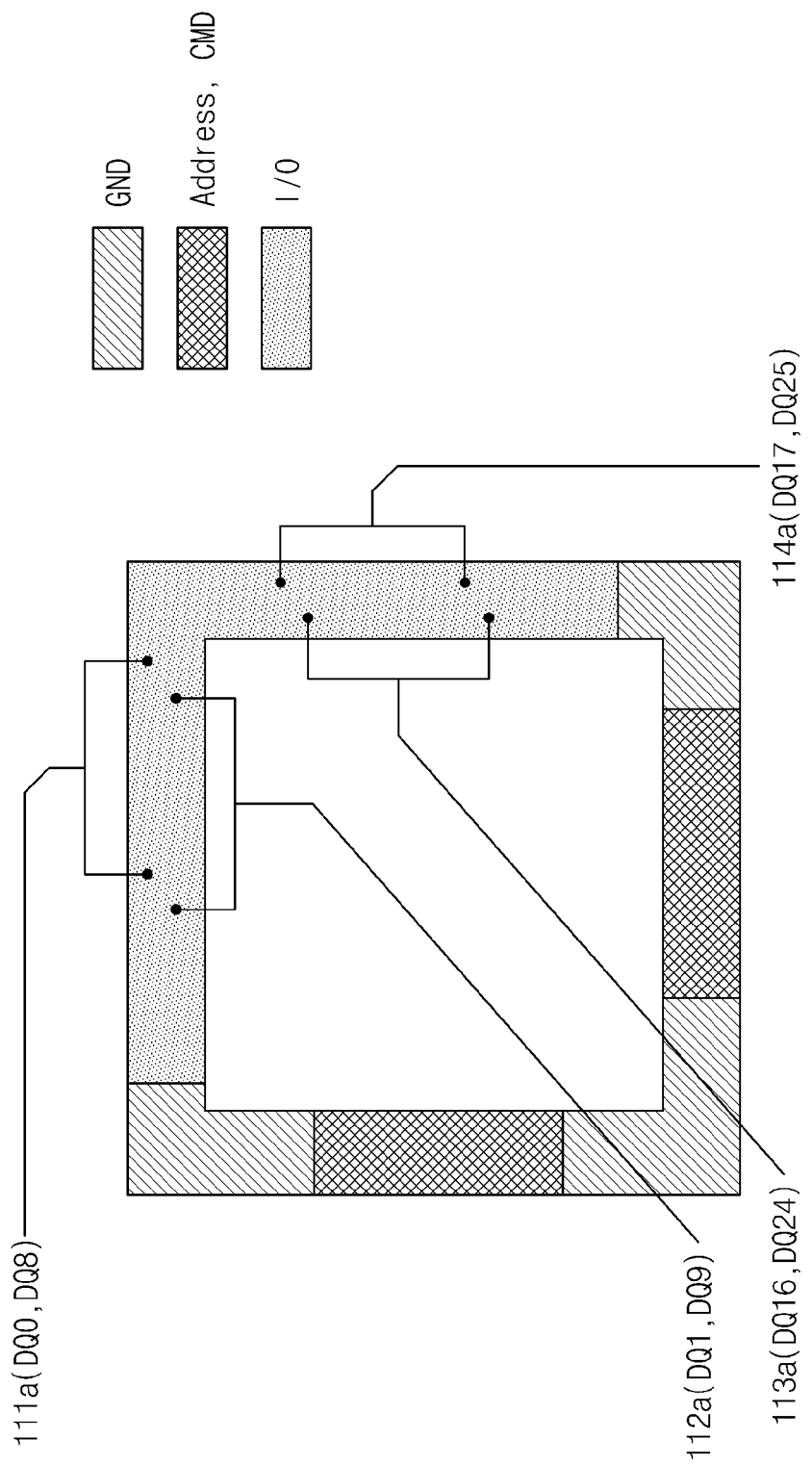
FIG. 6 is a wiring diagram illustrating a test signal path according to other example embodiments of the inventive concept.

FIG. 6 is a wiring diagram exemplarily illustrating a test signal path according to other example embodiments of the inventive concept. Referring to FIG. 6, four test signal paths 111a-114a may be provided in a single layer.

In example embodiments, at least one of the test signal paths may be shared by a plurality of DUTs.

Figure 7:
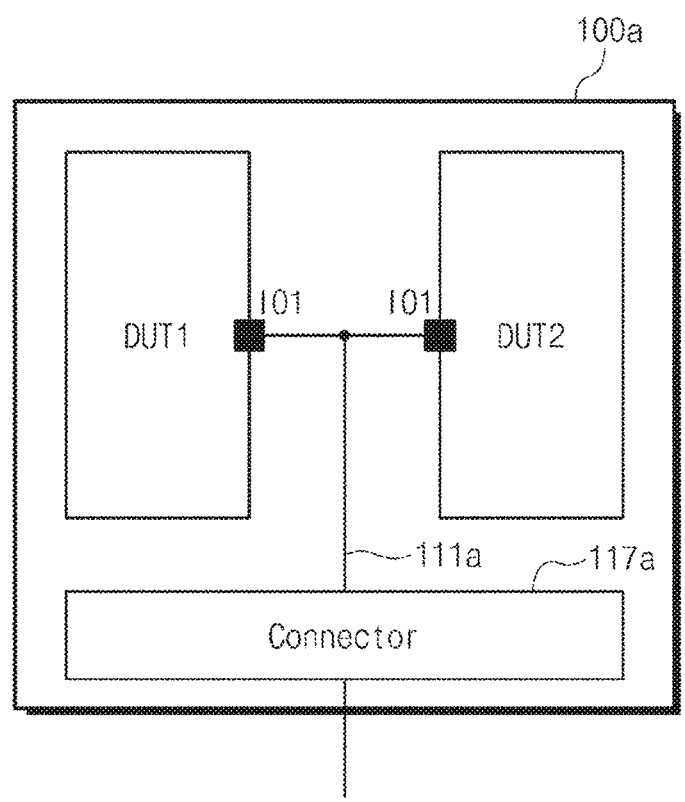
FIG. 7 is a schematic diagram illustrating a test board according to other example embodiments of the inventive concept.

FIG. 7 is a schematic diagram illustrating a test board 100a according to other example embodiments of the inventive concept. Referring to FIG. 7, one test signal path 111a may be shared by two DUTs (e.g., DUT1 and DUT2). The test signal path 111a connected to a connector 117a may be connected to both a first I/O pin IO1 of the first DUT1 and a first I/O pin IO1 of the second DUT2.

As shown in FIG. 7, one test signal path 111a may be connected to one I/O pin of the DUT1 and one I/O pin of the DUT2, but the inventive concept is not limited thereto. The test signal path may be connected to a plurality of I/O pins of the DUT.

As shown in FIG. 7, a plurality of DUTs (i.e., DUT1 and DUT2) may share one test signal path 111a, but the inventive concept is not limited thereto. The DUTs may be configured not to share the test signal path.

Figure 8:
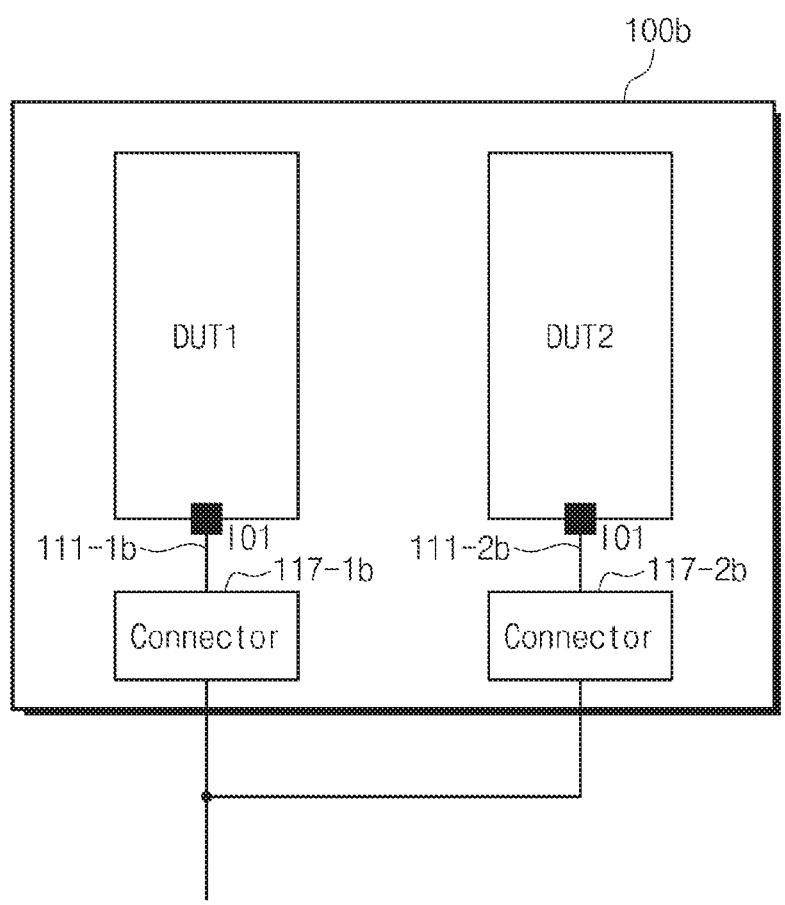
FIG. 8 is a schematic diagram illustrating a test board according to still other example embodiments of the inventive concept.

FIG. 8 is a schematic diagram exemplarily illustrating a test board 100b according to still other example embodiments of the inventive concept. Referring to FIG. 8, each of DUTs (e.g., DUT1 and DUT2) may be connected to a corresponding one of connectors 117-1b and 117-2b through a corresponding one of test signal paths 111-1b and 111-2b.

In example embodiments, the test signal paths 111-1b and 111-2b of the test board 110bd may be merged into a signal path using the connectors 117-1b and 117-2b.

Meanwhile, the test board may include a layer(s), in which at least one conductive material connected to power pins is provided.

Figure 9:
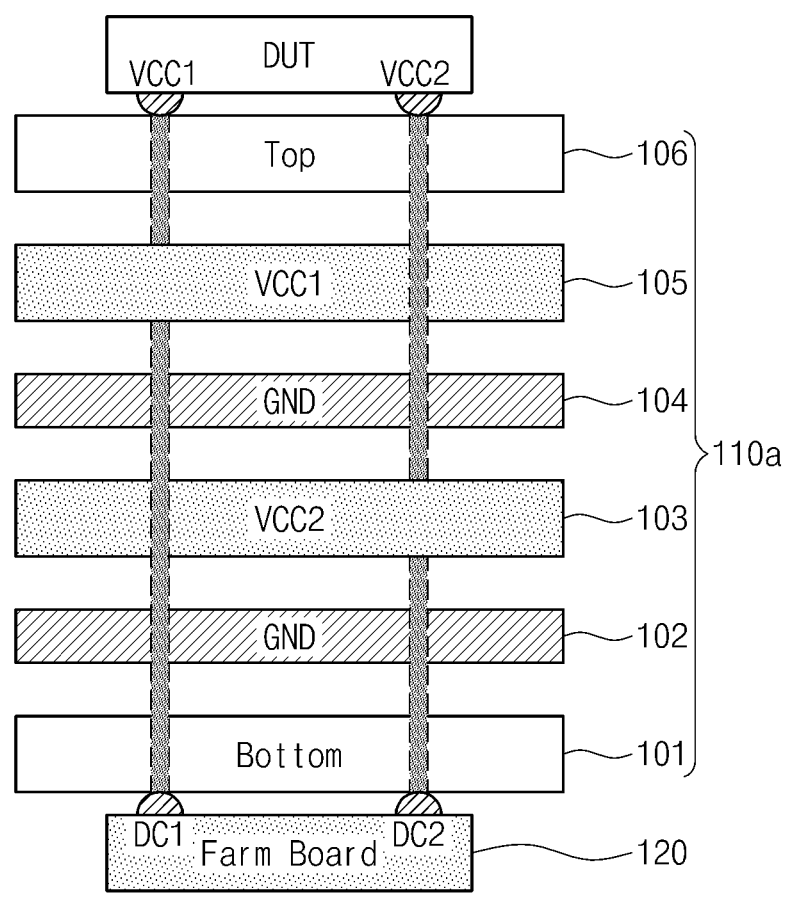
FIG. 9 is a schematic diagram illustrating vertical configuration of a test board according to other example embodiments of the inventive concept.

FIG. 9 is a schematic diagram illustrating vertical configuration of a test board 100a according to other example embodiments of the inventive concept. Referring to FIG. 9, the test board 100a may include a main board 110a with a plurality of layers 101-106. The first layer 101 may be the lowermost layer coupled to the farm board 120. The third and fifth layers 103 and 105 may include conductive materials applied with power voltages VCC1 and VCC2. The second and fourth layers 102 and 104 may be disposed between the third and fifth layers 103 and 105 and between the first and third layers 101 and 103, respectively, and each of them may include conductive materials applied with a ground voltage GND. The sixth layer 106 may be the uppermost layer coupled to a DUT.

As shown in FIG. 9, a pin of the DUT connected to the first power voltage VCC1 may be connected to the fifth layer 105 through a via, and the fifth layer 105 may be connected to a corresponding one (e.g., DC1) of pins of a farm board 120 through another via. Similarly, as shown in FIG. 9, another pin of the DUT connected to the second power voltage VCC2 may be connected to a third layer 113 through a via, and the third layer 113 may be connected to a corresponding one (e.g., DC2) of the pins of the farm board 120 through another via.

In order to reduce complexity in the drawings and to provide better understanding of example embodiments of the inventive concept, FIG. 9 illustrates an interconnection structure of power lines, which are connected to pins applied with two power voltages VCC1 and VCC2, but the number of power voltage pins is not limited thereto. The number of layers having the conductive materials may be changed depending on the number of the power voltage pins.

Moreover, although, in FIG. 9, layers associated with the power voltage are only illustrated as a part of the test board 110a, the test board 110a may further include other layers for realizing test signal paths associated with I/O pins or address/command pins.

Figure 10:
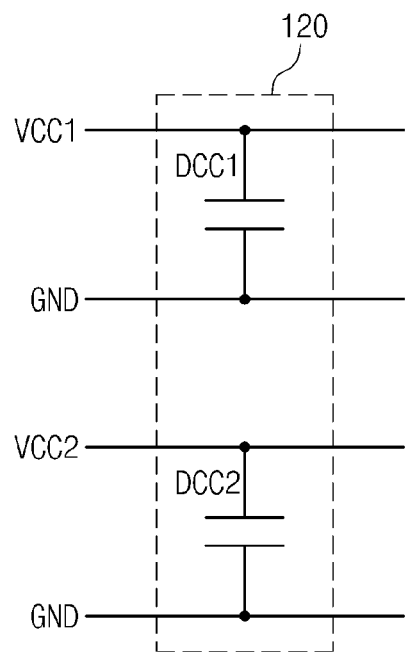
FIG. 10 is an equivalent circuit diagram of the farm board shown in FIG. 9 according to example embodiments of the inventive concept.

FIG. 10 is a circuit diagram equivalent to the farm board 120 shown in FIG. 9. For convenience of description, it is assumed that the farm board 120 is configured to include de-coupling capacitors DCC1 and DCC2. For example, as shown in FIG. 10, the first de-coupling capacitor DCC1 may be configured to connect the first power voltage VCC1 to the ground voltage GND, and the second de-coupling capacitor DCC2 may be configured to connect the second power voltage VCC2 to the ground voltage GND.

In example embodiments, even in the case that there is a transient variation in the first or second power voltages VCC1 and VCC2, electric charges stored in the first and second de-coupling capacitors DCC1 and DCC2 may allow the test board 100 to have a good power integrity property.

In certain embodiments, the farm board 120 may include a plurality of layers, in which passive elements are provided.

Figure 11:
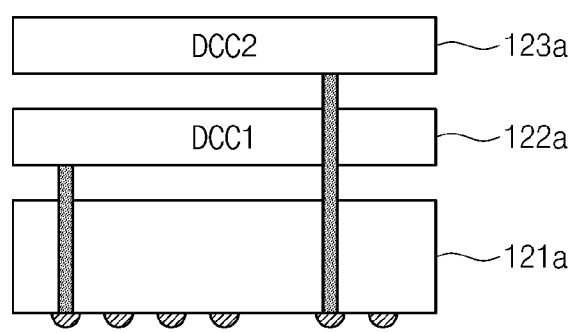
FIG. 11 is a schematic diagram illustrating a farm board according to other example embodiments of the inventive concept.

FIG. 11 is a schematic diagram illustrating a farm board 120a according to other example embodiments of the inventive concept. Referring to FIG. 11, a farm board 120a may include a first layer 121a, which has a plurality of contact portions connected to a main board of a test board and is positioned at a lowermost level, a second layer 122a with first de-coupling capacitors, and a third layer 123a with second de-coupling capacitors.

In example embodiments, the first and second de-coupling capacitors may be connected to the contact portions of the first layer 121a through vias.

In certain embodiments, a stacking order of the second and third layers 122a and 123a may be changed, if necessary.

Although the farm board 120a of FIG. 11 is illustrated to include layers with de-coupling capacitors, it may further include a layer, in which a passive element different from the de-coupling capacitors is provided.

Figure 12:
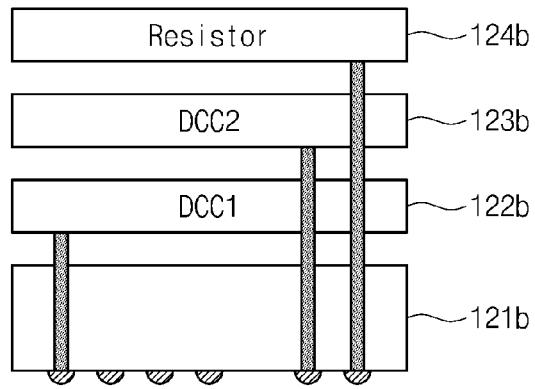
FIG. 12 is a schematic diagram illustrating a farm board according to still other example embodiments of the inventive concept.

FIG. 12 is a schematic diagram illustrating a farm board 120b according to still other example embodiments of the inventive concept. Referring to FIG. 12, a farm board 120b may include a first layer 121b, which has a plurality of contact portions connected to a main board of a test board and is positioned at a lowermost level, a second layer 122b with first de-coupling capacitors, a third layer 123b with second de-coupling capacitors, and a fourth layer 124b with a resistor.

In certain embodiments, a stacking order of the second to fourth layers 122b, 123b, and 124b may be changed, if necessary.

Figure 13:
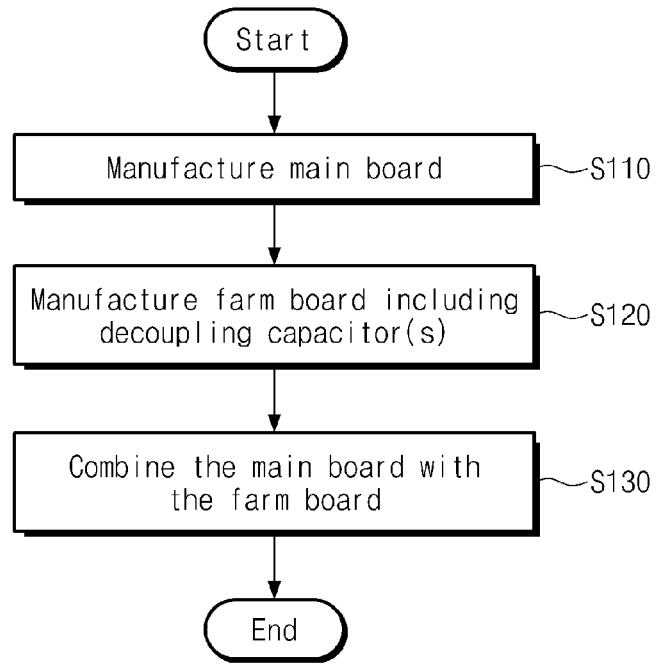
FIG. 13 is a flow chart illustrating a method of manufacturing a test board, according to example embodiments of the inventive concept.

FIG. 13 is a flow chart exemplarily illustrating a method of manufacturing a test board, according to example embodiments of the inventive concept. Referring to FIGS. 1 through 13, a test board may be manufactured by the following method.

A main board may be manufactured to have a plurality of layers constituting a plurality of test signal paths. Sockets may be provided on a top surface of the main board, and each of the sockets may be connected to a corresponding one of the DUTs (in S110). A farm board may be manufactured to include de-coupling capacitors (in S120). Thereafter, the main board and the farm board may be combined with each other (in S130). For example, the farm board may be attached to a bottom surface of the main board using solder balls. Here, the de-coupling capacitors may be electrically connected to power pins of the DUT, for example, through the main board. According to example embodiments of the inventive concept, in a method of manufacturing a test board, since the de-coupling capacitor is mounted on the farm board, it is possible to remarkably reduce manufacturing cost of the test board, compared with that of a related art one.

Meanwhile, according to example embodiments of the inventive concept, the farm board may be selectively connected to the main board, depending on a user's choice. For this, the main board may include a socket for such connection with the farm board.

Figure 14:
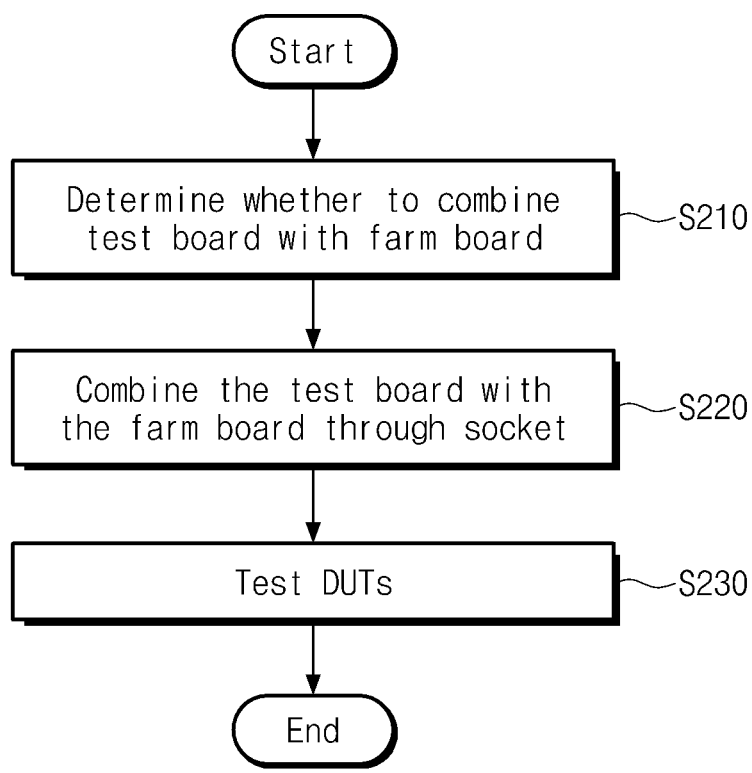
FIG. 14 is a flow chart illustrating a test method, according to example embodiments of the inventive concept.

FIG. 14 is a flow chart illustrating a test method, according to example embodiments of the inventive concept. Referring to FIGS. 1 through 14, a user may determine whether to connect a farm board with a main board of a test board according to a type of DUT (in S210). If there is a need to connect the farm board with the main board, the farm board may be mounted on a socket of main test board (in S220). In other words, the main board may be connected with the farm board through the socket. Thereafter, a test operation may be performed on DUTs through the test board connected to the DUTs (in S230).

According to example embodiments of the inventive concept, in the test method, the user may determine whether to connect the test board to the farm board.

In a related art test board for testing a semiconductor chip, a de-coupling capacitor is equipped to stabilize a power integrity property. However, to realize a test operation at a higher speed, it is necessary to realize a larger capacity (i.e., to increase the number of de-coupling capacitors). However, there is a limitation in providing an area for mounting de-coupling capacitors in a test board. Moreover, a de-coupling capacitor spaced far from a power pin may not provide its own function. Further, since a de-coupling capacitor is connected through a via, there may be several problems in realizing a PCB routing (for example, increase in processing difficulty and costs).

By contrast, according to example embodiments of the inventive concept, a de-coupling capacitor is provided in a farm board, not a related art test board. Accordingly, it is possible to collectively mount several de-coupling capacitors, which were provided in the related art test board, on a separate farm board. For example, several de-coupling capacitors may be directly connected to power pins of a PCB of the farm board. Thus, for the test board according to example embodiments of the inventive concept, it is possible to reduce a space or area required for mounting de-coupling capacitors and moreover to significantly reduce the number of components to be mounted on the PCB thereof, when compared with the related art test board. Accordingly, a test signal path of the test board can have a simplified routing structure, and this makes it possible to reduce manufacturing costs of a test board.

According to example embodiments of the inventive concept, a test board may include a farm board, in which a sufficiently number of de-coupling capacitors are provided.

Accordingly, the test board makes it possible to test a semiconductor chip at a high speed.

Further, in the test board according to example embodiments of the inventive concept, since the de-coupling capacitors are provided in the farm board, it is possible to overcome a limitation in area of the test board and to significantly reduce the number of components to be mounted in the test board.

In addition, according to example embodiments of the inventive concept, a test board can be configured to have a simple routing structure for test signal paths, and thus, it is possible to remarkably reduce manufacturing costs of the test board.

While example embodiments of the inventive concepts have been particularly shown and described, it will be understood by one of ordinary skill in the art that variations in form and detail may be made therein without departing from the spirit and scope of the attached claims.

What is claimed is:

1. A test board comprising:
 a main board configured to be connected to devices-under-test (DUTs), and comprising test signal paths configured to transmit test signals that are input from an external tester to pins of at least one of the DUTs and to transmit a test result from the at least one of the DUTs to the external tester; and
 a farm board connected to the main board, and comprising passive elements that are mounted on the farm board and are configured to be connected to at least one of the pins of the at least one of the DUTs through at least one of the test signal paths of the main board, when a test operation is performed,
 wherein the main board further comprises layers, at least one of the layers providing, among the test signal paths, two or more test signal paths configured to be connected to two input-output (I/O) pins of the at least one of the DUTs, and the at least one of the layers comprising an I/O pad region, a ground pad region, and a command/address pad region.

2. The test board of claim 1, wherein the main board or the farm board is provided in a form of a printed circuit board.

3. The test board of claim 1, wherein the at least one of the layers of the main board is configured to provide four or six test signal paths connected to the two input-output I/O pins of the at least one of the DUTs.

4. The test board of claim 1, wherein at least one of the test signal paths is configured to be shared by at least two of the DUTs.

5. The test board of claim 1, wherein at least one of the test signal paths comprises a via penetrating at least two of the layers.

6. The test board of claim 1, further comprising connectors configured to be connected to the pins of the at least one of the DUTs, receive the test signals from the external tester, and transmit the test result to the external tester.

7. The test board of claim 1, further comprising solder balls connecting the main board to the farm board.

8. The test board of claim 1, wherein the main board further comprises a via configured to connect a pin of the farm board to at least one of the pins of the at least one of the DUTs.

9. The test board of claim 8, wherein the pins of the at least one of the DUTs comprises at least one power voltage pin and at least one ground voltage pin, and
 wherein the main board further comprises:
  at least one first layer comprising a conductive material, and configured to be connected to the at least one power voltage pin; and
  at least one second layer comprising a conductive material, and configured to be connected to the at least one ground voltage pin.

10. The test board of claim 1, wherein the farm board further comprises layers comprising test signal paths configured to connect the passive elements to the main board.

11. A test system, comprising:
 the test board of claim 1;
 the DUTs of claim 1; and
 the external tester of claim 1, the external tester being configured to generate the test signals of claim 1 in the test operation of claim 1.

12. The test system of claim 11, wherein the pins comprises a first power voltage pin, a second power voltage pin, and a ground voltage pin, and
 wherein the main board further comprises:
  a first layer comprising a conductive material, and configured to be connected to the first power voltage pin;
  a second layer comprising a conductive material, and configured to be connected to the second power voltage pin; and
  a third layer interposed between the first layer and the second layer, and comprising a conductive material, the third layer being configured to be connected to the ground voltage pin.

13. A test board comprising:
 a first board configured to be connected to devices for testing of the devices, and comprising test signal paths through which test signals for the testing are exchanged between an external tester and terminals of at least one of the devices; and
 terminals configured to be connected to a second board comprising passive elements so that at least one of the passive elements is connected to at least one of the terminals of the at least one of the devices through at least one of the test signal paths included in the first board,
 wherein the first board further comprises layers, at least one of the layers providing, among the test signal paths, two or more test signal paths configured to be connected to two input-output (I/O) pins of the at least one of the devices, and the at least one of the layers comprising an I/O pad region, a ground pad region, and a command/address pad region.

14. The test board of claim 13, wherein the first board further comprises at least one first layer configured to be connected to a power voltage, and at least one second layer configured to be connected to a ground voltage.

15. A method of manufacturing a test board, comprising:
 manufacturing a main board comprising at least one socket configured to allow for electrical connections with devices-under-test (DUTs), the main board further comprising test signal paths configured to be connected to pins of at least one of the DUTs;
 manufacturing a farm board comprising at least one de-coupling capacitor; and
 connecting the farm board with the main board to connect at least one power voltage pin of the pins of the at least one of the DUTs electrically with the de-coupling capacitor,
 wherein the main board further comprises layers, at least one of the layers providing, among the test signal paths, two or more test signal paths configured to be connected to two input-output (I/O) pins of the at least one of the DUTs, and the at least one of the layers comprising an I/O pad region, a ground pad region, and a command/address pad region.

16. The method of claim 15, wherein the farm board is connected to the main board, using a socket.

17. The method of claim 15, wherein the farm board is connected to the main board, using solder balls.

* * * * *